(12) United States Patent
Lubomirsky et al.

(10) Patent No.: US 9,285,168 B2
(45) Date of Patent: Mar. 15, 2016

(54) MODULE FOR OZONE CURE AND POST-CURE MOISTURE TREATMENT

(75) Inventors: Dmitry Lubomirsky, Cupertino, CA (US); Jay D. Pinson, II, San Jose, CA (US); Kirby H. Floyd, San Jose, CA (US); Adib Khan, Santa Clara, CA (US); Shankar Venkataraman, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1140 days.

(21) Appl. No.: 13/247,687

(22) Filed: Sep. 28, 2011

(65) Prior Publication Data

US 2012/0079982 A1 Apr. 5, 2012

Related U.S. Application Data

(60) Provisional application No. 61/389,957, filed on Oct. 5, 2010.

(51) Int. Cl.
*F26B 25/00* (2006.01)
*H01L 21/67* (2006.01)
(Continued)

(52) U.S. Cl.
CPC ............. *F26B 25/004* (2013.01); *C23C 16/56* (2013.01); *H01L 21/6719* (2013.01);
(Continued)

(58) Field of Classification Search
CPC ............ F26B 25/004; H01L 21/67178; H01L 21/67207; H01L 21/67196; H01L 21/67201; H01L 21/6719; H01L 21/02126; H01L 21/02216; H01L 21/02222; H01L 21/02274; H01L 21/31612; H01L 21/02337; H01L 21/02348; H01L 21/3105; H01L 21/02315; H01L 21/3122; H01L 21/3125; C23C 16/401; C23C 16/56

USPC .................................................. 134/1.1, 1.2
See application file for complete search history.

(56) References Cited

U.S. PATENT DOCUMENTS 4,147,571 A 4/1979 Stringfellow et al.
4,200,666 A 4/1980 Reinberg
(Continued)

FOREIGN PATENT DOCUMENTS

DE 19654737 A1 7/1997
EP 0892083 A1 1/1999
(Continued)

OTHER PUBLICATIONS

Franz, et al., "Conversion of silicon nitride into silicon dioxide through the influence of oxygen," Solid-State Electronics, Jun. 1971, pp. 449-505, vol. 14, Issue 6, Germany. Abstract Only.
(Continued)

*Primary Examiner* — Jeffrie R Lund
(74) *Attorney, Agent, or Firm* — Patterson & Sheridan, LLP

(57) ABSTRACT

A substrate processing system that has a plurality of deposition chambers, and one or more robotic arms for moving a substrate between one or more of a deposition chamber, load lock holding area, and a curing and treatment module. The substrate curing and treatment module is attached to the load-lock substrate holding area, and may include: The curing chamber for curing a dielectric layer in an atmosphere comprising ozone, and a treatment chamber for treating the cured dielectric layer in an atmosphere comprising water vapor. The chambers may be vertically aligned, have one or more access doors, and may include a heating system to adjust the curing and/or heating chambers between two or more temperatures respectively.

13 Claims, 6 Drawing Sheets

(51) Int. Cl.
*H01L 21/02* (2006.01)
*H01L 21/3105* (2006.01)
*C23C 16/40* (2006.01)
*C23C 16/56* (2006.01)

(52) U.S. Cl.
CPC ... *H01L 21/67178* (2013.01); *H01L 21/67196* (2013.01); *H01L 21/67201* (2013.01); *H01L 21/67207* (2013.01); *C23C 16/401* (2013.01); *H01L 21/02126* (2013.01); *H01L 21/02337* (2013.01); *H01L 21/3105* (2013.01)

(56) References Cited

U.S. PATENT DOCUMENTS

| | | |
|---|---|---|
| 4,816,098 A | 3/1989 | Davis et al. |
| 4,818,326 A | 4/1989 | Liu et al. |
| 4,910,043 A | 3/1990 | Freeman et al. |
| 4,931,354 A | 6/1990 | Wakino et al. |
| 4,946,593 A | 8/1990 | Pinigis |
| 5,016,332 A | 5/1991 | Reichelderfer et al. |
| 5,110,407 A | 5/1992 | Ono et al. |
| 5,212,119 A | 5/1993 | Hah et al. |
| 5,271,972 A | 12/1993 | Kwok et al. |
| 5,279,784 A | 1/1994 | Bender et al. |
| 5,364,488 A | 11/1994 | Minato et al. |
| 5,393,708 A | 2/1995 | Hsia et al. |
| 5,426,076 A | 6/1995 | Moghadam |
| 5,434,109 A | 7/1995 | Geissler et al. |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,578,532 A | 11/1996 | van de Ven et al. |
| 5,587,014 A | 12/1996 | Iyechika et al. |
| 5,593,741 A | 1/1997 | Ikeda |
| 5,620,525 A | 4/1997 | van de Ven et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,843,233 A | 12/1998 | van de Ven et al. |
| 5,853,607 A | 12/1998 | Zhao et al. |
| 5,882,417 A | 3/1999 | van de Ven et al. |
| 5,925,411 A | 7/1999 | van de Ven et al. |
| 5,926,737 A | 7/1999 | Ameen et al. |
| 5,935,340 A | 8/1999 | Xia et al. |
| 5,937,308 A | 8/1999 | Gardner et al. |
| 5,937,323 A | 8/1999 | Orczyk et al. |
| 5,961,850 A | 10/1999 | Satou et al. |
| 5,966,595 A | 10/1999 | Thakur et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,024,044 A | 2/2000 | Law et al. |
| 6,087,243 A | 7/2000 | Wang |
| 6,090,442 A | 7/2000 | Klaus et al. |
| 6,090,723 A | 7/2000 | Thakur et al. |
| 6,110,838 A | 8/2000 | Loewenstein |
| 6,114,219 A | 9/2000 | Spikes et al. |
| 6,121,130 A | 9/2000 | Chua et al. |
| 6,140,242 A | 10/2000 | Oh et al. |
| 6,146,970 A | 11/2000 | Witek et al. |
| 6,150,286 A | 11/2000 | Sun et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,191,004 B1 | 2/2001 | Hsiao |
| 6,207,587 B1 | 3/2001 | Li et al. |
| 6,211,040 B1 | 4/2001 | Liu et al. |
| 6,258,690 B1 | 7/2001 | Zenke |
| 6,287,962 B1 | 9/2001 | Lin |
| 6,296,255 B1 | 10/2001 | Hashimoto |
| 6,302,964 B1 | 10/2001 | Umotoy et al. |
| 6,339,997 B1 | 1/2002 | Nakagawa et al. |
| 6,355,581 B1 | 3/2002 | Vassiliev et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B2 | 9/2002 | Yau et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,583,063 B1 | 6/2003 | Kahn et al. |
| 6,583,069 B1 | 6/2003 | Vassiliev et al. |
| 6,589,868 B2 | 7/2003 | Rossman |
| 6,596,654 B1 | 7/2003 | Bayman et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,656,804 B2 | 12/2003 | Tsujikawa et al. |
| 6,660,391 B1 | 12/2003 | Rose et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,800,571 B2 | 10/2004 | Cheung et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,833,578 B1 | 12/2004 | Tu et al. |
| 6,835,278 B2 | 12/2004 | Selbrede et al. |
| 6,849,520 B2 | 2/2005 | Kim et al. |
| 6,858,523 B2 | 2/2005 | Deboer et al. |
| 6,858,533 B2 | 2/2005 | Chu et al. |
| 6,867,086 B1 | 3/2005 | Chen et al. |
| 6,872,323 B1 | 3/2005 | Entley et al. |
| 6,875,687 B1 | 4/2005 | Weidman et al. |
| 6,890,403 B2 | 5/2005 | Cheung |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,033,960 B1 * | 4/2006 | You et al. ............... 438/786 |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |

(56) References Cited

U.S. PATENT DOCUMENTS

| | | |
|---|---|---|
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,514,375 B1 | 4/2009 | Shanker et al. |
| 7,521,378 B2 | 4/2009 | Fucsko et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,622,369 B1 | 11/2009 | Lee et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,915,139 B1 | 3/2011 | Lang et al. |
| 7,935,643 B2 | 5/2011 | Liang et al. |
| 7,943,514 B2 | 5/2011 | West |
| 7,943,531 B2 | 5/2011 | Nemani et al. |
| 7,989,365 B2 | 8/2011 | Park et al. |
| 7,994,019 B1 | 8/2011 | Kweskin et al. |
| 8,119,544 B2 | 2/2012 | Hasebe et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,264,066 B2 | 9/2012 | Lo et al. |
| 8,304,351 B2 | 11/2012 | Wang et al. |
| 8,318,584 B2 | 11/2012 | Li et al. |
| 8,445,078 B2 | 5/2013 | Liang et al. |
| 8,449,942 B2 | 5/2013 | Liang et al. |
| 8,466,067 B2 | 6/2013 | Liang et al. |
| 8,466,073 B2 | 6/2013 | Wang et al. |
| 9,153,442 B2 * | 10/2015 | Wang .................. H01L 21/6708 |
| 2001/0021595 A1 | 9/2001 | Jang |
| 2001/0029114 A1 | 10/2001 | Vulpio et al. |
| 2001/0038919 A1 | 11/2001 | Berry et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0027286 A1 | 3/2002 | Sundararajan et al. |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0081842 A1 | 6/2002 | Sambucetti et al. |
| 2002/0086166 A1 | 7/2002 | Hendricks et al. |
| 2002/0113039 A1 * | 8/2002 | Mok et al. .................. 216/92 |
| 2002/0119607 A1 | 8/2002 | Miyasaka et al. |
| 2002/0127350 A1 | 9/2002 | Ishikawa et al. |
| 2002/0129769 A1 | 9/2002 | Kim et al. |
| 2002/0134506 A1 * | 9/2002 | Franklin .......... H01L 21/67017 156/345.31 |
| 2002/0142585 A1 | 10/2002 | Mandal |
| 2002/0146879 A1 | 10/2002 | Fu et al. |
| 2002/0160585 A1 | 10/2002 | Park |
| 2002/0164421 A1 | 11/2002 | Chiang et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1 | 12/2002 | Ballantine et al. |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0077918 A1 | 4/2003 | Wu et al. |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0203653 A1 | 10/2003 | Buchanan et al. |
| 2003/0207561 A1 | 11/2003 | Dubin et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0029353 A1 | 2/2004 | Zheng et al. |
| 2004/0048492 A1 | 3/2004 | Ishikawa et al. |
| 2004/0064965 A1 * | 4/2004 | Huang ............................ 34/406 |
| 2004/0065253 A1 | 4/2004 | Tois et al. |
| 2004/0079118 A1 | 4/2004 | M'Saad et al. |
| 2004/0082131 A1 | 4/2004 | Tsujikawa et al. |
| 2004/0084680 A1 | 5/2004 | Ruelke et al. |
| 2004/0110354 A1 | 6/2004 | Natzle et al. |
| 2004/0139983 A1 | 7/2004 | Lakshmanan et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0183202 A1 | 9/2004 | Usami |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0216672 A1 * | 11/2004 | Ishii ........................ C23C 16/54 118/719 |
| 2004/0216844 A1 | 11/2004 | Janakiraman et al. |
| 2004/0219780 A1 | 11/2004 | Ohuchi |
| 2004/0224534 A1 | 11/2004 | Beulens et al. |
| 2004/0231590 A1 | 11/2004 | Ovshinsky |
| 2004/0241342 A1 | 12/2004 | Karim et al. |
| 2004/0253826 A1 | 12/2004 | Ivanov et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0042889 A1 | 2/2005 | Lee et al. |
| 2005/0062165 A1 | 3/2005 | Saenger et al. |
| 2005/0087140 A1 | 4/2005 | Yuda et al. |
| 2005/0097771 A1 * | 5/2005 | Yi et al. ............................ 34/444 |
| 2005/0112901 A1 | 5/2005 | Ji et al. |
| 2005/0118794 A1 | 6/2005 | Babayan et al. |
| 2005/0121145 A1 | 6/2005 | Du Bois et al. |
| 2005/0142895 A1 | 6/2005 | Ingle et al. |
| 2005/0153574 A1 | 7/2005 | Mandal |
| 2005/0160974 A1 | 7/2005 | Ivanov et al. |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2005/0287775 A1 | 12/2005 | Hasebe et al. |
| 2006/0011984 A1 | 1/2006 | Currie |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046427 A1 | 3/2006 | Ingle et al. |
| 2006/0046506 A1 | 3/2006 | Fukiage |
| 2006/0055004 A1 | 3/2006 | Gates et al. |

(56) References Cited

U.S. PATENT DOCUMENTS

| | | |
|---|---|---|
| 2006/0068599 A1 | 3/2006 | Baek et al. |
| 2006/0075966 A1 | 4/2006 | Chen et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |
| 2006/0102977 A1 | 5/2006 | Fucsko et al. |
| 2006/0105106 A1 | 5/2006 | Balseanu et al. |
| 2006/0110939 A1 | 5/2006 | Joshi et al. |
| 2006/0110943 A1 | 5/2006 | Swerts et al. |
| 2006/0121394 A1 | 6/2006 | Chi |
| 2006/0158101 A1 | 7/2006 | Camilletti et al. |
| 2006/0159847 A1 | 7/2006 | Porter et al. |
| 2006/0160372 A1 | 7/2006 | Dorfman |
| 2006/0162661 A1 | 7/2006 | Jung et al. |
| 2006/0178018 A1 | 8/2006 | Olsen |
| 2006/0211265 A1 | 9/2006 | Trott |
| 2006/0223315 A1 | 10/2006 | Yokota et al. |
| 2006/0228903 A1 | 10/2006 | McSwiney et al. |
| 2006/0252240 A1 | 11/2006 | Gschwandtner et al. |
| 2006/0263522 A1 | 11/2006 | Byun |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0010072 A1 | 1/2007 | Bailey et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0065578 A1 | 3/2007 | McDougall |
| 2007/0066022 A1 | 3/2007 | Chen et al. |
| 2007/0077777 A1 | 4/2007 | Gumpher |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0111546 A1 | 5/2007 | Iyer et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0275569 A1 | 11/2007 | Moghadam et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1 | 12/2007 | Ingle et al. |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014711 A1 | 1/2008 | Choi et al. |
| 2008/0014759 A1 | 1/2008 | Chua et al. |
| 2008/0020591 A1 | 1/2008 | Balseanu et al. |
| 2008/0026597 A1 | 1/2008 | Munro et al. |
| 2008/0038486 A1 | 2/2008 | Treichel et al. |
| 2008/0063809 A1* | 3/2008 | Lee ............... H01L 21/3105 427/558 |
| 2008/0070409 A1 | 3/2008 | Park et al. |
| 2008/0081104 A1 | 4/2008 | Hasebe et al. |
| 2008/0085607 A1 | 4/2008 | Yu et al. |
| 2008/0096364 A1 | 4/2008 | Wilson et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0182382 A1 | 7/2008 | Ingle et al. |
| 2008/0188087 A1 | 8/2008 | Chen et al. |
| 2008/0202419 A1* | 8/2008 | Smith ............... C23C 14/566 118/719 |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0276867 A1* | 11/2008 | Schaller ....................... 118/719 |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0054674 A1 | 2/2009 | Lukas et al. |
| 2009/0061647 A1 | 3/2009 | Mallick et al. |
| 2009/0075490 A1 | 3/2009 | Dussarrat et al. |
| 2009/0093132 A1 | 4/2009 | Xu et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0104798 A1 | 4/2009 | Hirano |
| 2009/0142935 A1 | 6/2009 | Fukazawa et al. |
| 2009/0156017 A1* | 6/2009 | Fukazawa et al. ........... 438/788 |
| 2009/0170282 A1 | 7/2009 | Dong |
| 2009/0181550 A1 | 7/2009 | Hasebe et al. |
| 2009/0194809 A1 | 8/2009 | Cho |
| 2009/0203225 A1 | 8/2009 | Gates et al. |
| 2009/0206409 A1 | 8/2009 | Arisumi et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1* | 10/2009 | Ma et al. ....................... 257/316 |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0052066 A1 | 3/2010 | Yu et al. |
| 2010/0059889 A1 | 3/2010 | Gosset et al. |
| 2010/0081094 A1 | 4/2010 | Hasebe et al. |
| 2010/0081293 A1 | 4/2010 | Mallick et al. |
| 2010/0099236 A1 | 4/2010 | Kwon et al. |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190317 A1 | 7/2010 | Iwasawa et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0227276 A1 | 9/2010 | Mizuno |
| 2010/0255655 A1 | 10/2010 | Mallick et al. |
| 2010/0261318 A1 | 10/2010 | Feng et al. |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0186990 A1 | 8/2011 | Mawatari et al. |
| 2011/0187000 A1 | 8/2011 | West |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0074387 A1 | 3/2012 | King |
| 2012/0079982 A1* | 4/2012 | Lubomirsky ........ F26B 25/004 118/58 |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |
| 2012/0122302 A1 | 5/2012 | Weidman et al. |
| 2012/0142192 A1 | 6/2012 | Li et al. |
| 2012/0145079 A1 | 6/2012 | Lubomirsky et al. |
| 2012/0161405 A1 | 6/2012 | Mohn et al. |

(56) References Cited

U.S. PATENT DOCUMENTS

| | | |
|---|---|---|
| 2012/0177846 A1 | 7/2012 | Li et al. |
| 2012/0190178 A1 | 7/2012 | Wang et al. |
| 2012/0193778 A1 | 8/2012 | Mawatari |
| 2012/0213940 A1 | 8/2012 | Mallick |
| 2012/0225565 A1 | 9/2012 | Bhatia et al. |
| 2012/0238108 A1 | 9/2012 | Chen et al. |
| 2012/0269989 A1 | 10/2012 | Liang et al. |
| 2012/0292720 A1 | 11/2012 | Chen et al. |
| 2012/0309205 A1 | 12/2012 | Wang et al. |
| 2013/0062736 A1 | 3/2013 | Brighton et al. |
| 2013/0084711 A1 | 4/2013 | Liang et al. |
| 2013/0149462 A1 | 6/2013 | Liang et al. |
| 2013/0193578 A1 | 8/2013 | Yu et al. |
| 2015/0235865 A1* | 8/2015 | Wang .................. H01L 21/324 438/704 |

FOREIGN PATENT DOCUMENTS

| | | | |
|---|---|---|---|
| EP | 1095958 B1 | 5/2001 | |
| EP | 1717848 A | 11/2006 | |
| JP | 61-234534 A | 10/1986 | |
| JP | 64-048425 A | 2/1989 | |
| JP | 1-198033 A | 8/1989 | |
| JP | 01-235259 A | 9/1989 | |
| JP | 01241826 A | 9/1989 | |
| JP | 03-197684 A | 8/1991 | |
| JP | 03-286531 | 12/1991 | |
| JP | 2004-328825 | 11/1992 | |
| JP | 05-152215 | * 6/1993 | |
| JP | 05-259156 | 10/1993 | |
| JP | 05-304147 A | 11/1993 | |
| JP | 06-077150 A | 3/1994 | |
| JP | 6-168930 A | 6/1994 | |
| JP | 07-014826 A | 1/1995 | |
| JP | 07-169762 A | 7/1995 | |
| JP | 07-316823 A | 12/1995 | |
| JP | 07-321178 | * 12/1995 | |
| JP | 08-236518 A | 9/1996 | |
| JP | 08-288286 A | 11/1996 | |
| JP | 09-237785 A | 9/1997 | |
| JP | 10-163183 A | 6/1998 | |
| JP | 11-274285 A | 10/1999 | |
| JP | 2001-148382 A | 5/2001 | |
| JP | 2002-370059 A | 12/2002 | |
| JP | 2003-179054 | 6/2003 | |
| JP | 2004-012315 | 1/2004 | |
| JP | 2004-327639 | 11/2004 | |
| JP | 2005-142448 A | 6/2005 | |
| JP | 2005-268396 A | 9/2005 | |
| JP | 2005-302848 A | 10/2005 | |
| JP | 2008-159824 A | 7/2008 | |
| JP | 2008/218684 A | 9/2008 | |
| JP | 2011-220127 A | 11/2011 | |
| KR | 10-2004-0091978 A | 11/2004 | |
| KR | 1020040104533 A | 12/2004 | |
| KR | 10-2005-0003758 A | 1/2005 | |
| KR | 10-2005-0072332 | 7/2005 | |
| KR | 10-2005-0085838 | 8/2005 | |
| KR | 10-2005-0094183 A | 9/2005 | |
| KR | 1020060081350 A | 7/2006 | |
| KR | 10-2009-0011765 A | 2/2009 | |
| KR | 10-2009-0121361 | 11/2009 | |
| KR | 10-2009-0122860 A | 12/2009 | |
| KR | 10-2010-0085743 | 7/2010 | |
| TW | 200514163 | 4/2005 | |
| TW | 200707582 | 2/2007 | |
| WO | 02/077320 A1 | 10/2002 | |
| WO | 03/066933 A | 8/2003 | |
| WO | 2005/078784 A | 8/2005 | |
| WO | 2007/040856 A2 | 4/2007 | |
| WO | 2007/140376 A | 12/2007 | |
| WO | 2007/140424 A | 12/2007 | |
| WO | 2009/055340 A1 | 4/2009 | |
| WO | 2010/080216 | 7/2010 | |
| WO | 2012/145148 | 10/2012 | |
| WO | 2013/025336 | 2/2013 | |

OTHER PUBLICATIONS

International Search Report and Written Opinion of PCT/US2011/066275, mailed Sep. 24, 2012, 9 pages.

Tripp, et al., "The Anodic Oxidation of Silicon Nitride Films on Silicon," Journal of the Electrochemical Society, 1970, pp. 157-159, 117(2).

Usenko, et al., "Silicon Nitride Surface Conversion into Oxide to Enable Hydrophilic Bonding," ECS Meeting Abstracts, 2010, 1 page, Abstract #1716, 218th ECS Meeting.

International Search Report and Written Opinion of PCT/US2011/054635, mailed Jul. 9, 2012, 11 pages.

International Search Report and Written Opinion of PCT/US2011/066601, mailed Jul. 20, 2012, 10 pages.

Alexandrov, Sergei E., et al., "Formation of Silicon Nitride Films by Remote Plasma-enhanced Chemical Vapour Deposition". Advanced Materials for Optics and Electronics, vol. 2, 301-312 (1993).

Aylett, B. J. et al., "Silicon-Nitrogen Compounds. Part V. Diphenylamino-derivatives of Silane," J. Chem. Soc. (A), Apr. 1969, pp. 636-638.

Aylett, B. J. et al., "Silicon-Nitrogen Compounds. Part VI.[1] The Preparation and Properties of Disilazane," J. Chem. Soc. (A), Apr. 1969, pp. 639-642.

Aylett, B. J. et al., "The Preparation and Some Properties of Disilylamine—Correspondence," Inorganic Chemistry, Jan. 1966, p. 167.

Beach, David B., "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31, No. 20.

Bowen, C., et al., "New Processing Techniques: Sweeping of Quartz Wafers and a Practical Method for Processing Quartz Resonators Under Controlled Conditions,", Proceedings of the 1992 IEEE Frequency Control Symposium, pp. 648-656.

Burg, Anton B. et al., "Silyl-Amino Boron Compounds," J. Amer. Chem. Soc., Jul. 1950, pp. 3103-3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Gulleri, G. et al., "Deposition Temperature Determination of HDPCVD Silicon Dioxide Films," 2005, Microelectronic Engineering, vol. 82, pp. 236-241.

International Search Report and Written Opinion of PCT/US2011/054981, mailed May 9, 2012, 10 pages.

International Search Report and Written Opinion of PCT/US2011/054984, mailed May 11, 2012, 10 pages.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec. 2006, p. 14.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Loboda, M.J., et al., "Chemical influence of inert gas on the thin film stress in plasma-enhanced chemical vapor deposited a-SiN:H films". Journal of Materials Research, vol. 11, No. 2, Feb. 1996, pp. 391-398.

(56) References Cited

OTHER PUBLICATIONS

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

Norman, Arlan D. et al., "Reaction of Silylphosphine with Ammonia," Inorganic Chemistry, Jun. 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY, US, vol. 4, No. 3, Part 01, May 1, 1986, pp. 480-485.

Ward, L. G. L. et al., "The Preparation and Properties of Bis-Disilanyl Sulphide and *Tris*-Disilanylamine," J. Inorg. Nucl. Chem., Dec. 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.

International Search Report and Written Opinion of PCT/US2012/026786, mailed Jan. 2, 2013, 7 pages.

International Search Report and Written Opinion of PCT/US2012/031640 mailed Oct. 18, 2012, 10 pages.

International Search Report and Written Opinion of PCT/US2012/039629, mailed Dec. 26, 2012, 6 pages.

International Search Report and Written Opinion of PCT/US2012/053999, mailed Feb. 27, 2013, 12 pages.

International Search Report and Written Opinion of PCT/US2012/065086, mailed Mar. 25, 2013, 10 pages.

International Search Report and Written Opinion of PCT/US2012/059400, mailed Mar. 26, 2013, 11 pages.

Wang Li et al., "Properties of Hydrogenated Amorphous Silicon Caarbide Films Irradiated by Excimer Pulse Laser," 1998, Abstract Only.

Ying-Yu et al., "Preparation of SiC Thin Film Using Organosilicon by Remote Plasma CVD Method," 1999, Abstract Only.

Chinese Office Action (with attached English translation of the Search Report) for Application No. 201180049232.0 dated May 5, 2015; 12 total pages.

\* cited by examiner

MODULE FOR OZONE CURE AND POST-CURE MOISTURE TREATMENT

CROSS-REFERENCES TO RELATED APPLICATIONS

This application is a non-provisional, and claims the benefit, of commonly assigned U.S. Provisional Application No. 61/389,957, filed Oct. 5, 2010, entitled "Module for Ozone Cure and Post-Cure Moisture Treatment," the entirety of which is herein incorporated by reference for all purposes.

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The decreasing feature sizes result in structural features on the device having decreased spatial dimensions. The reduced dimensions, in turn, require the use of conductive materials having a very low resistivity and insulation materials having a very low dielectric constant.

Low dielectric constant films are particularly desirable for premetal dielectric (PMD) layers and intermetal dielectric (IMD) layers to reduce the RC time delay of the interconnect metalization, to prevent cross-talk between the different levels of metalization, and to reduce device power consumption. Undoped silicon oxide films deposited using early CVD techniques typically had a dielectric constant ($\kappa$) in the range of 4.0 to 4.2. In contrast, various carbon-based dielectric layers that are now commonly used in the semiconductor industry have dielectric constants below 3.0. Many of these carbon-based layers are relatively unstable when initially deposited and are subsequently cured in an oxygen environment and/or annealed to increase the film's stability.

BRIEF SUMMARY OF THE INVENTION

A substrate curing and treatment module is described for performing the curing and post-cure treatment of dielectric layers deposited on the substrate. The modules may include a separate curing chamber and treatment chamber. Substrates may be transferred to the curing chamber of the module with uncured layers deposited thereon by an FCVD process. The deposition process may form an uncured silicon-oxygen-carbon containing layer, silicon-oxygen-nitrogen containing layer, and/or silicon-oxygen-nitrogen-carbon containing layer on the substrate. When the substrate is transferred to the curing chamber, the deposited layer or layers may be cured at temperatures of about 150° C. to about 200° C. in an ozone-containing atmosphere. After the curing, the substrate may be transferred to the treatment chamber of the module an exposed to a water-vapor containing atmosphere at temperatures above the dew point (e.g., about 80° C. to about 100° C.) to form the treated dielectric film. For some fabrication processes, the cured and treated substrates removed from the module are transferred through a load-lock chamber and factory interface (FI) to a front-opening unified pod (FOUP) that stores the substrate as it is removed from the fabrication system.

Embodiments of the invention include a substrate curing and treatment module. The module may include a curing chamber for curing a dielectric layer in an atmosphere that includes ozone, and a treatment chamber for treating the cured dielectric layer in an atmosphere that includes water vapor. The curing chamber may be vertically positioned with respect to the treatment chamber. The module may also include a heating system operatively coupled to the curing chamber and the treatment chamber. The heating system may be operative to adjust a first temperature of the curing chamber to from about 150° C. to about 200° C., and to adjust a second temperature of the treatment chamber to from about 80° C. to about 100° C. The module may further include an access door on both the curing chamber and the treatment chamber. Each access door is operable to be moved to an open position to receive a substrate, and operable to be moved to a closed sealed position during while the substrate is being cured or treated.

Embodiments of the invention further include a substrate processing system that has a plurality of deposition chambers, and a first robotic arm operable to move a substrate between one of the deposition chambers and a load-lock substrate holding area. The system may also have a second robotic arm operable to move the substrate between the load-lock substrate holding area and a curing chamber of a substrate curing and treatment module. The substrate curing and treatment module is attached to the load-lock substrate holding area, and may include: The curing chamber for curing a dielectric layer in an atmosphere comprising ozone, and a treatment chamber for treating the cured dielectric layer in an atmosphere comprising water vapor. The curing chamber may be vertically positioned with respect to the treatment chamber. The module may also include a heating system operatively coupled to the curing chamber and the treatment chamber, where the heating system is operative to adjust a first temperature of the curing chamber to from about 150° C. to about 200° C., and to adjust a second temperature of the treatment chamber to from about 80° C. to about 100° C. The module may still further include an access door on both the curing chamber and the treatment chamber. Each of the access doors are operable to be moved to an open position to receive a substrate, and operable to be moved to a closed sealed position during while the substrate is being cured or treated.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Figure 1:
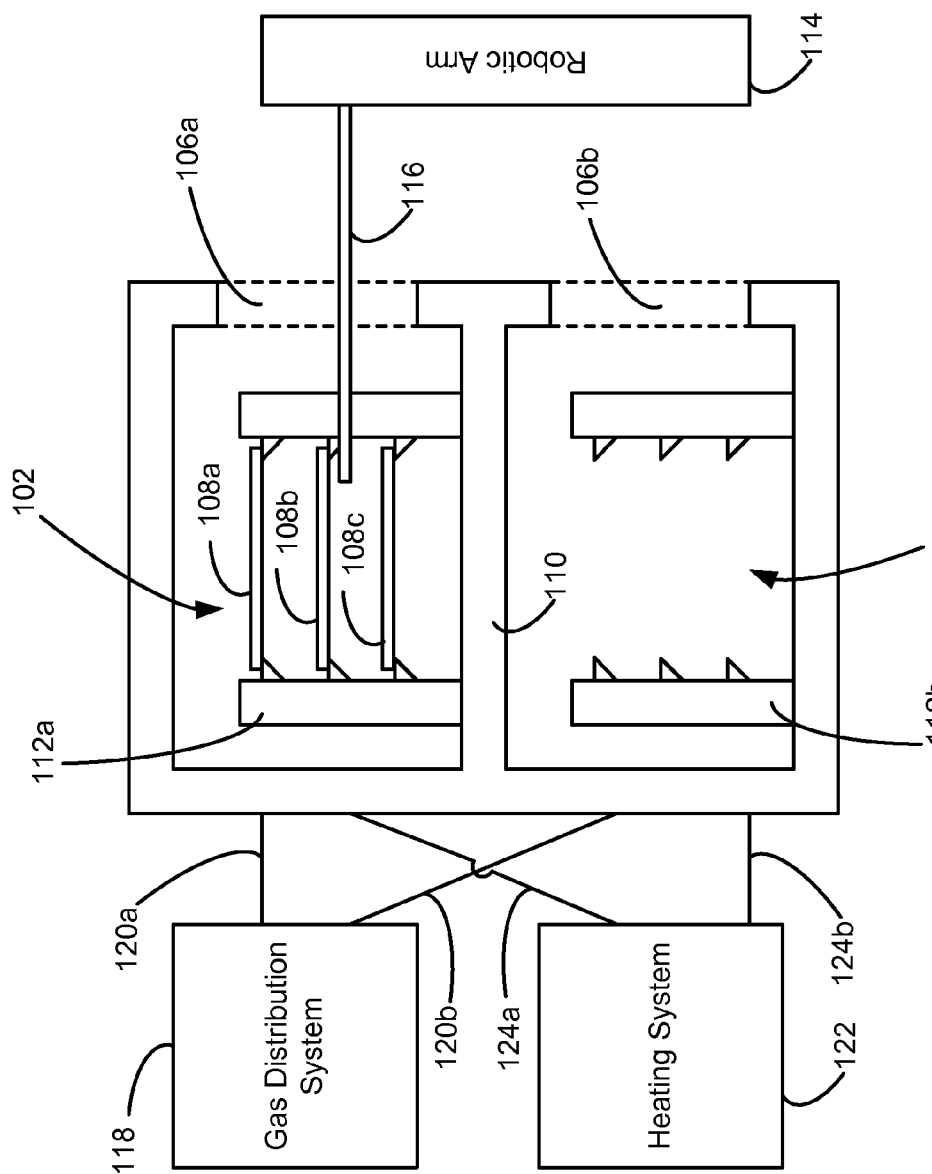
FIG. 1 shows a simplified cross-section drawing of a substrate curing and treatment module according to embodiments of the invention.

FIG. 1 shows a substrate curing and treatment module 100 that includes a curing chamber 102 and a treatment chamber 104 vertically positioned with respect to each other. In module 100, the curing chamber is shown vertically positioned above the treatment chamber 102, while additional embodiments may reverse this order and position the treatment chamber above the curing chamber. Module 100 also shows the two chambers separated by a common wall 110 having opposite sides exposed to the interiors of the curing chamber 102 and treatment chamber 104, respectively. Additional embodiments may have two separate walls that define the bottom of the curing chamber 102 and the top of the treatment chamber 104, respectively. The separate walls may be reversibly or permanently attached to each other, or alternatively, they may be separated by a gap which may or may not be filled with and insulating material.

Both chambers include an access door 106a-b that is operable to move to an open position to receive one or more substrates 108a-c, and also operable to move to a closed sealed position while the substrate is being cured or treated. Module 100 shows substrate racks 112a-b that can hold a plurality of substrates 108a-c in the chambers at the same time. This makes module 100 a batch cure and treatment module that can perform curing and treatment steps simultaneously on multiple substrates (e.g., 2 or more substrates, 3 or more substrates, 4 or more substrates, 5 or more substrates, 10 or more substrates, etc.). Additional embodiments may include an alternate structure for holding the substrates, such as a platen that may be translatable in a vertical, horizontal, and/or circular direction. These alternate structures may be operable to hold a single substrate or multiple substrates.

The module 100 may receive substrates from a robotic arm 114 that has a positioning arm 116 operable to move a substrate into and out of the curing chamber 102 and transfer chamber 104. The positioning arm 116 may place a substrate 108a-c into the substrate rack 112a of the curing chamber 102, and later remove the cured substrate from the curing chamber. The positing arm 116 may also transfer the cured substrate from the curing chamber 102 to the substrate rack 112b of the treatment chamber 104. The arm 116 may also remove the cured and treated substrate from the treatment chamber 104. In the embodiment shown, the positioning arm 116 may be extended into and retracted from the chambers of module 100, as well as move in a vertical direction between the chambers. The arm 116 may also rotate to receive or place substrates from a substrate holding area near the module 100.

The module 100 may also include a gas distribution system 118 and heating system 122 coupled to the curing and treatment chambers, respectively, to control the atmospheric conditions and temperatures of the chambers. As noted above, substrate curing may include exposing the substrate to an ozone-containing atmosphere at about 150° C. to about 200° C., and substrate treatment may include exposing the cured substrate to an water-vapor containing atmosphere at about 80° C. to about 100° C.

The gas distribution system 118 is operable to control the flow of gases from a gas source (not shown) into the curing chamber 102 and treatment chamber 104. In module 100, the delivery mechanism includes gas conduits 120a-b that transport gases from the gas delivery system to each of the chambers. The gas delivery system may also include a gas return (not shown) that removes gases from the chambers of module 100. The gas return may be coupled to a vacuum pump and exhaust that are fluidly coupled to the module 100.

The gases delivered by gas distribution system 118 to the curing chamber 102 may include molecular oxygen, ozone, argon, and molecular nitrogen, among other gases. The gases may be mixed and sent to the curing chamber 102 in a single stream, or provided separately and first mixed in the chamber. The gases delivered to the treatment chamber 104 by distribution system 118 may include water vapor, argon, and molecular nitrogen, among other gases.

The heating system 122 is operatively coupled to heating elements (not shown) in both the curing chamber 102 and the treatment chamber 104. These heating elements are independently controlled by the heating system 122 to permit the temperature of the curing chamber 102 to be different than the temperature of the treatment chamber 104. Independent temperature sensors (not shown) may be present in the chambers to monitor the chamber temperature and provide feedback to the heating system 122 for adjusting and/or maintaining the temperature in the chamber.

Figure 2:
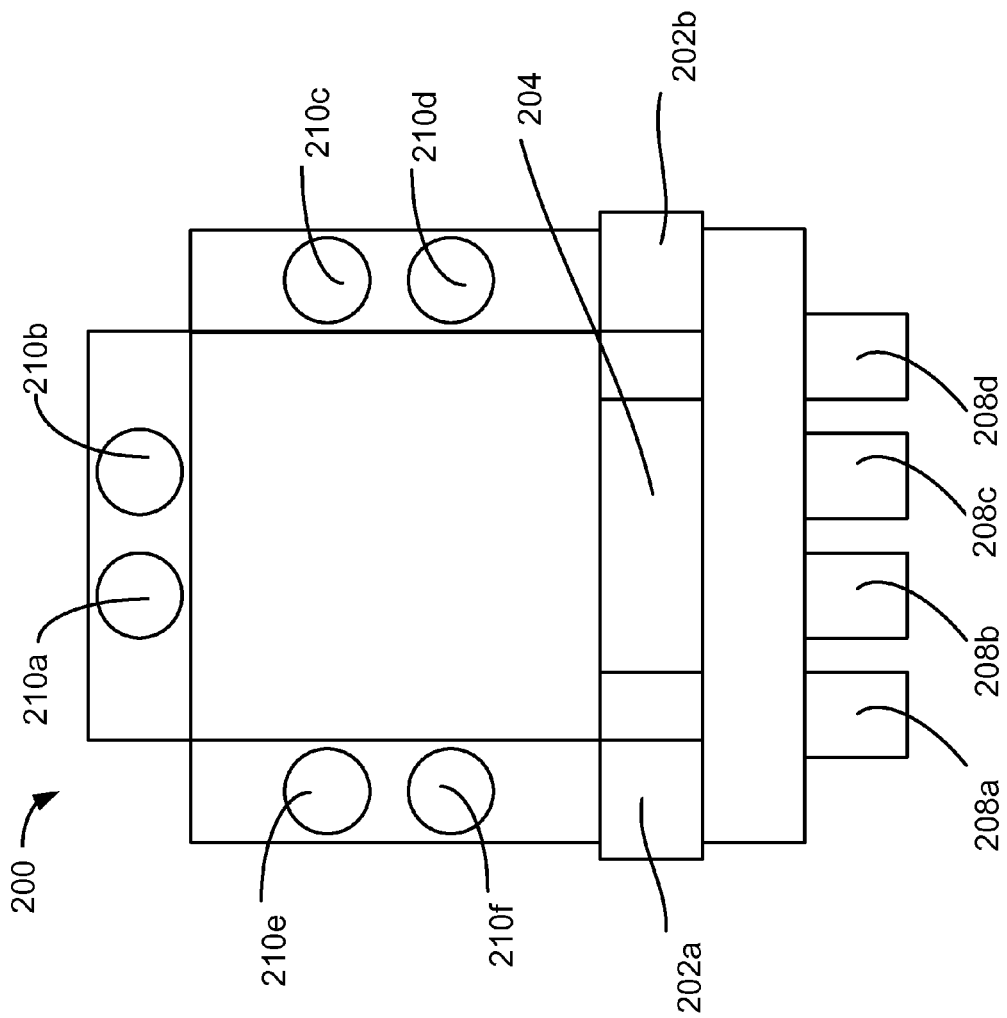
FIG. 2 shows a simplified drawing of substrate processing system that includes a pair of substrate curing and treatment modules according to embodiments of the invention.
Figure 3:
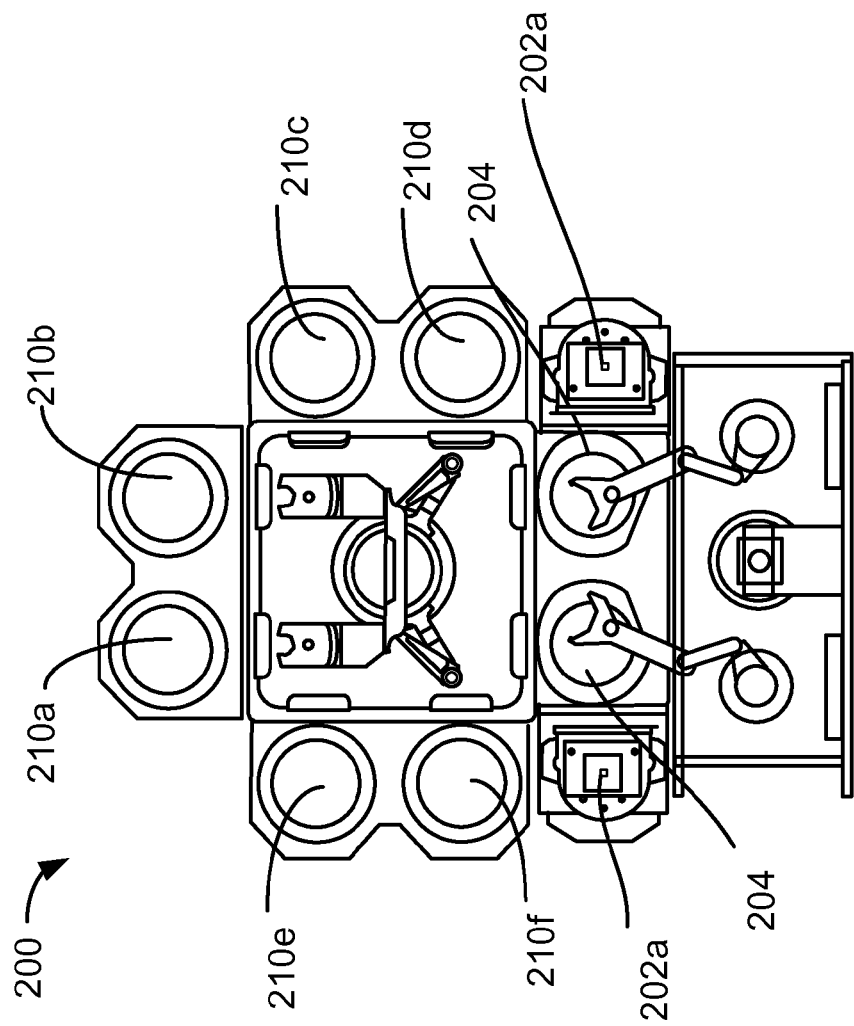
FIG. 3 shows another drawing of a substrate processing system with a pair of substrate curing and treatment modules coupled to a load-lock chamber according to embodiments of the invention.

Referring now to FIGS. 2 and 3, a substrate processing system 200 is shown that includes a pair of substrate curing and treatment modules 202a-b, according to embodiments of the invention. Commercial examples of system 200 may include specific configurations of the Centura™, Producer™, and Eterna™ systems manufactured by Applied Materials of Santa Clara Calif.

As shown in FIG. 2, the modules 202a-b are positioned at opposite ends of a load-lock chamber 204, and behind the factory interface (FI) 206 of the system 200. In the configuration of system 200 shown, this positioning places the modules 202a-b behind the FI 206 without increasing the overall width of the system, and without displacing two of the four FOUPs 208a-b reversibly coupled to the front side of the system.

The modules 202a-b may be reversibly, and substantially leak-tightly coupled to the load-lock chamber 204. The coupling mechanism may include reversible fasteners (e.g., threaded bolts, screws, etc.) and gaskets that leak-tightly couple the modules 202a-b to the load-lock chamber. The load-lock chamber 204 includes openings aligned with the access doors of the curing and treatment chambers of the modules 202a-b, to permit a robot arm to transfer substrates between the load-lock chamber and the modules.

Substrate wafers may be provided to the system through the FOUPs 208a-d, which may sealingly couple to the FI 206. The substrates may pass through the FI 206 and into the load-lock chamber 204 with the aid of a robotic arm (not shown) positioned in the FI. Another robotic arm may then transfer the substrate from the load-lock chamber 204 to one of the processing chambers 210a-f that deposit one or more uncured dielectric layers on the substrate.

After the deposition, the robotic arm may transfer the substrate from the processing chamber 210a-f back to the load-lock chamber 204, where the initial robotic arm may place the substrate into a curing chamber of one of the modules 202a-b through an open access door in the chamber. As noted in the description of FIG. 1 above, after the robot arm has placed the uncured substrate in the curing chamber, the access door may be placed in a closed-sealed position while the gas distribution system and heating system adjust the environment in the curing chamber to a curing state. Once the dielectric layer(s) on the substrate has been cured, the access door may be opened, and the robot arm may take the cured substrate and transfer it to the treatment chamber of the same module 210a-b. The access door of the treatment chamber may be placed in a closed-sealed position while the gas distribution system and heating system adjust the environment of the chamber to a treatment state to produce a cured and treated substrate. At the end of the treatment process, the access door may be opened, and the robot arm may remove the cured, treated substrate from the module 210a-b and return it to a FOUP 208a-d while the substrate awaits removal from system 200. Alternatively, the cured, treated substrate may be transferred back to one or more of the processing chambers 210a-f for additional deposition, etching, CMP, etc., before finally being transferred to one of the FOUPs 208a-d.

Figure 4A:
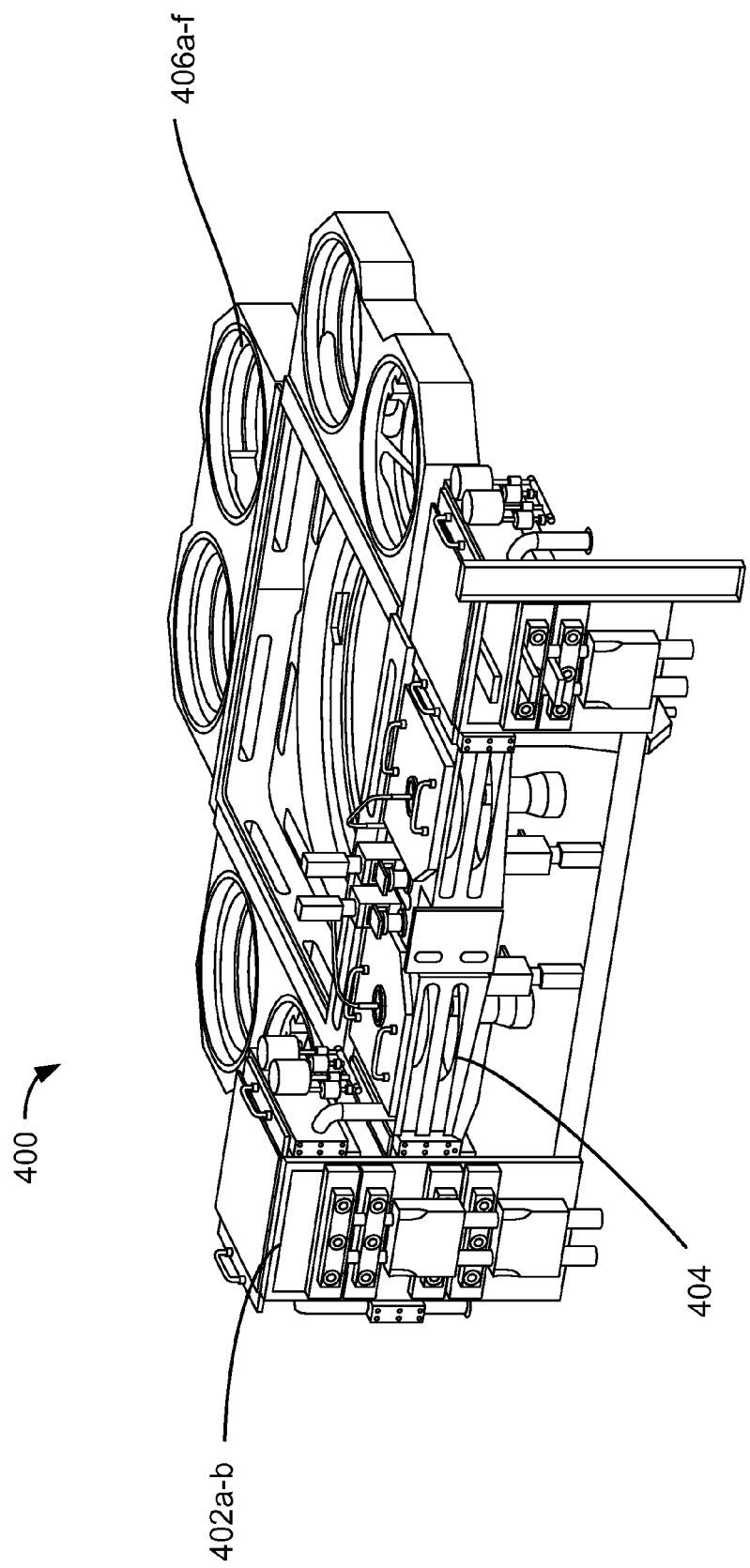
FIG. 4A shows a simplified front-side perspective drawing of a substrate processing system with a pair of substrate curing and treatment modules positioned on opposite sides of a load-lock chamber that interfaces with a set of substrate processing chambers according to embodiments of the invention.
Figure 4B:
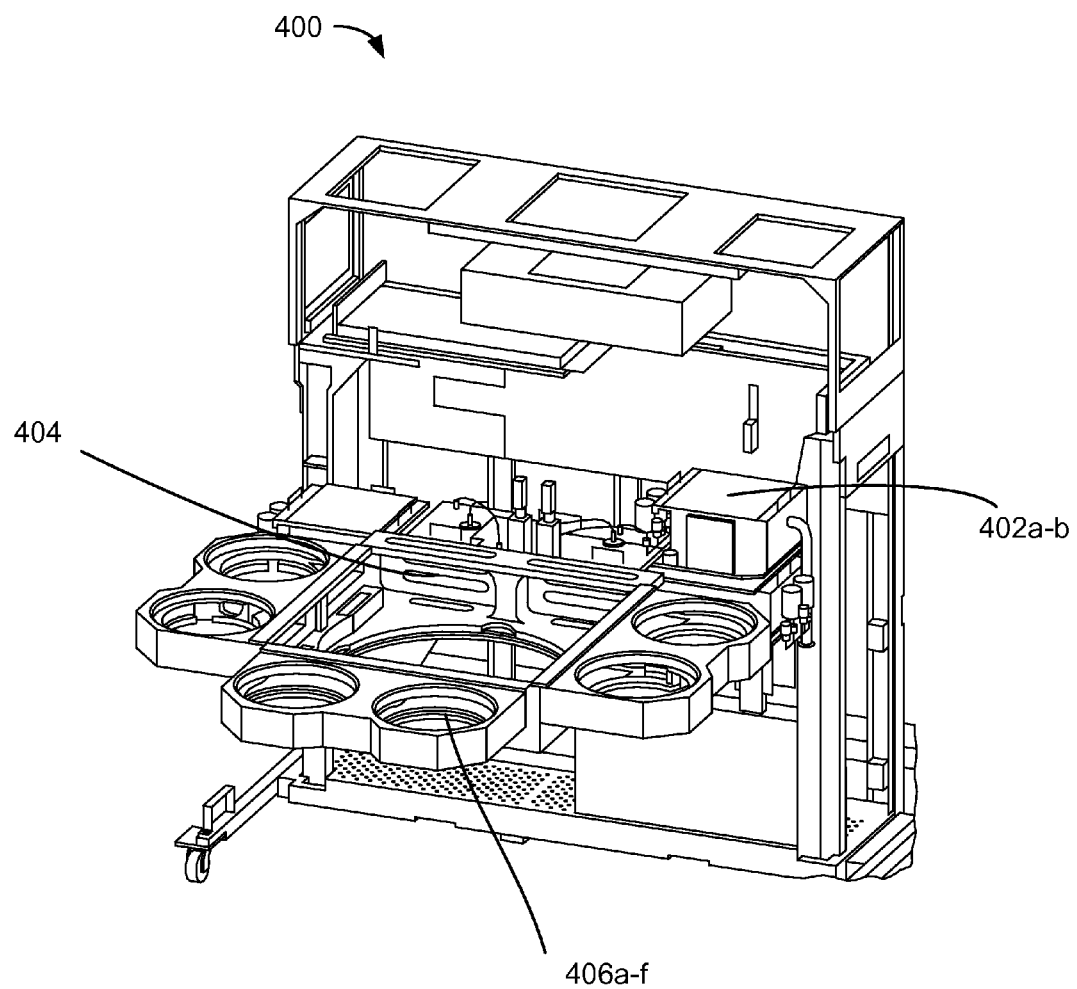
FIG. 4B shows a simplified back-side perspective drawing of a substrate processing system with a pair of substrate curing and treatment modules positioned on opposite sides of a load-lock chamber that interfaces with a set of substrate processing chambers according to embodiments of the invention.

FIGS. 4A&B show simplified front and back-side perspective drawings, respectively, of a substrate processing system 400 where a pair of substrate curing and treatment modules 402a-b are positioned on opposite sides of a load-lock chamber 404 that interfaces with a set of substrate processing chambers 406a-f according to embodiments of the invention. These figures show the modules 402a-b attached on opposite sides of the load-lock chamber as substantially planar to a front side of the load-lock chamber that attached to the factory interface (not shown). As noted above, this configuration of the modules 402a-b permit them to be integrated with the overall substrate processing system 400 without increasing the width of the system 400, or interfering with the coupling of the load-lock chamber 406 with the FI.

Figure 5:
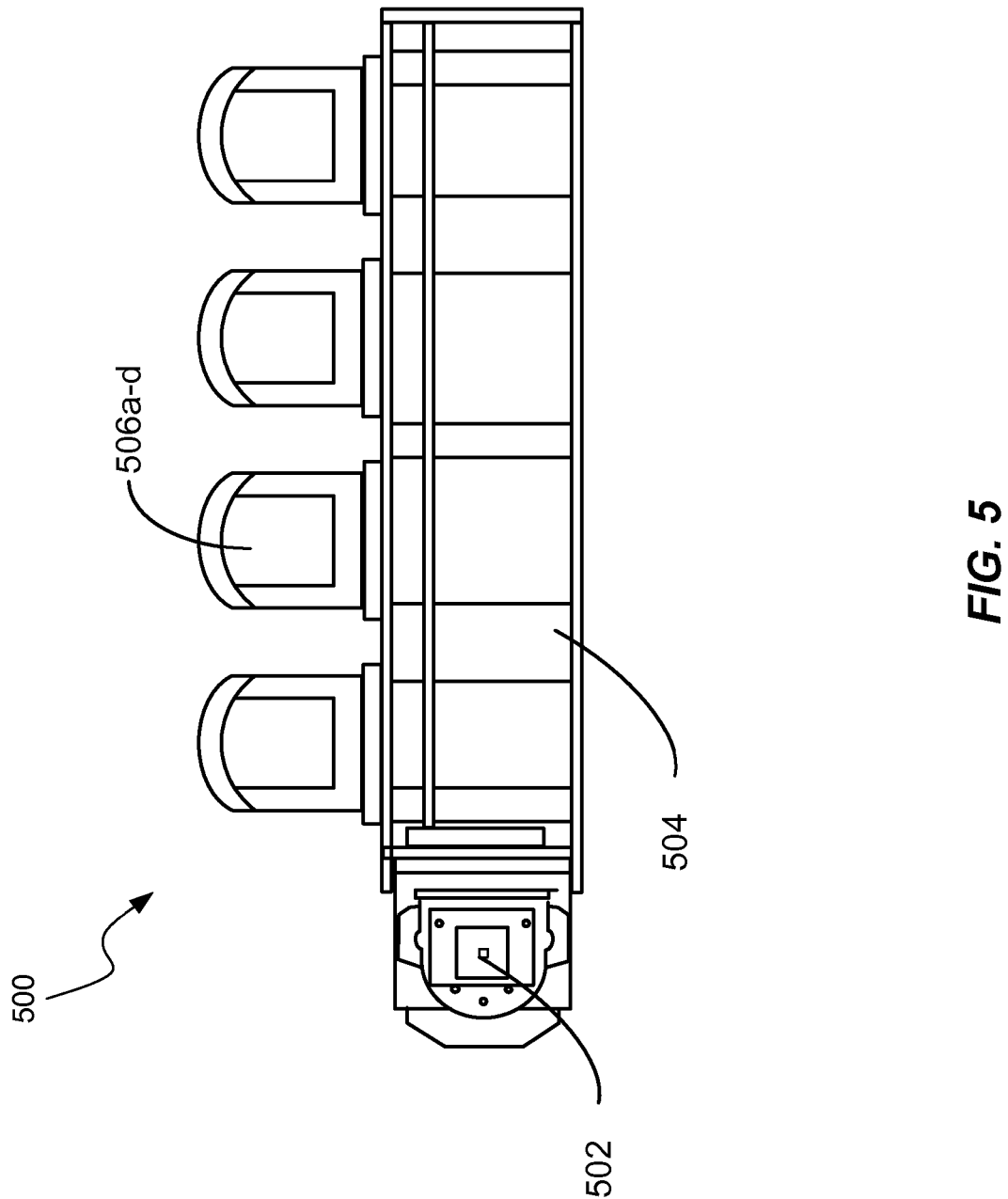
FIG. 5 shows a simplified overhead view of a substrate processing system with a substrate curing and treatment module positioned adjacent to the factory interface.

FIG. 5 shows a simplified overhead view of a substrate processing system 500 having a substrate curing and treatment module 502 positioned adjacent to the FI 504. Positioning of the curing and treatment module 502 adjacent to the FI may allow reduced movement of substrates from the deposition chambers on the backside of the FI (not shown), as well as delivery of the substrates from the curing and treatment module 502 to the FOUPs 506a-d located on the front side of the FI. The curing and treatment modules may be located on one or both sides of the FI.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the substrate" includes reference to one or more substrates and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A substrate processing system comprising:
    a plurality of deposition chambers;
    a load-lock chamber;
    a first robotic arm operable to move a substrate between one of the deposition chambers and the load-lock chamber;
    a pair of substrate curing and treatment modules disposed on opposite ends of the load-lock chamber, wherein each of the substrate curing and treatment module comprises:
        a curing chamber for curing a dielectric layer in an atmosphere comprising ozone;
        a treatment chamber for treating the cured dielectric layer in an atmosphere comprising water vapor, wherein the curing chamber is vertically positioned with respect to the treatment chamber;
        a heating system operatively coupled to the curing chamber and the treatment chamber, wherein the heating system is operative to adjust a first temperature of the curing chamber to from about 150° C. to about 200° C., and to adjust a second temperature of the treatment chamber to from about 80° C. to about 100° C.; and
        an access door on both the curing chamber and the treatment chamber, wherein each of the access doors are operable to be moved to an open position to receive a substrate, and operable to be moved to a closed sealed position while the substrate is being cured or treated; and
    a second robotic arm operable to move the substrate between the load-lock chamber and the curing chamber of the substrate curing and treatment module.

2. The system of claim 1, wherein the second robotic arm is operable to remove the substrate from the curing chamber and deliver the substrate to the treatment chamber.

3. The system of claim 1, further comprising a plurality of substrate curing and treatment modules, wherein each of the substrate curing and treatment modules is attached to the load-lock chamber.

4. The system of claim 1, wherein each of the curing chamber and the treatment chamber comprises a substrate rack to receive a plurality of substrates at the same time.

5. A substrate processing system, comprising:
    a factory interface;
    a plurality of processing chambers;

a load-lock chamber disposed on a backside of the factory interface, wherein the load-lock chamber connects the factory interface and the plurality of processing chambers; and a first substrate curing and treatment module coupled to a first end of the load-lock chamber, wherein the first substrate curing and treatment module comprises:

a curing chamber comprising:
  a substrate rack for holding a plurality of substrates; and
  an access door operable to be moved to an open position to receive a substrate, and operable to be moved to a closed sealed position during curing, wherein the load lock chamber includes an opening aligned with the access door of the curing chamber; and a treatment chamber comprising:
  a substrate rack for holding a plurality of substrates; and
  an access door operable to be moved to an open position to receive a substrate, and operable to be moved to a closed sealed position during treatment, wherein the load lock chamber includes an opening aligned with the access door of the treatment chamber, wherein the curing chamber and the treatment chamber are vertically stacked together.

6. The substrate processing system of claim 5, further comprising:
a second substrate curing and treatment module coupled to a second end of the load-lock chamber, wherein the second end is opposite to the first end.

7. The substrate processing system of claim 5, wherein the curing chamber and treatment chamber are separated by a common wall.

8. The substrate processing system of claim 5, wherein the first substrate curing and treatment module further comprises:
a heating system operatively coupled to the curing chamber and the treatment chamber, wherein the heating system is operative to adjust a first temperature of the curing chamber to from about 150° C. to about 200° C., and to adjust a second temperature of the treatment chamber to from about 80° C. to about 100° C.

9. The substrate processing system of claim 8, wherein the first substrate curing and treatment module further comprises:
a gas distribution system operable to control flow of gases from a gas source into the curing chamber and the treatment chamber.

10. The substrate processing system of claim 9, wherein the first substrate curing and treatment module further comprises:
a gas return fluidly connected to a vacuum pump.

11. The substrate processing system of claim 5, further comprising a robotic arm operable to move substrates between the load-lock chamber and the curing chamber of the first substrate curing and treatment module.

12. The substrate processing system of claim 11, wherein the robotic arm is disposed in the factory interface.

13. The substrate processing system of claim 12, further comprising a plurality of front-opening unified pods (FOUPs) disposed on a front side of the factory interface, wherein the robotic arm is operable to transfer substrates between the FOUPs and the first curing and treatment module.

* * * * *